(12) United States Patent
Barber et al.

(10) Patent No.: US 6,242,989 B1
(45) Date of Patent: Jun. 5, 2001

(54) ARTICLE COMPRISING A MULTI-PORT VARIABLE CAPACITOR

(75) Inventors: Bradley Paul Barber, Chatham; David J. Bishop, Summit; Peter L. Gammel, Millburn, all of NJ (US); Matthew A. Marcus, Santa Clara, CA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/152,185

(22) Filed: Sep. 12, 1998

(51) Int. Cl.[7] ..................................... H03B 1/01
(52) U.S. Cl. ............... 331/177 V; 361/271; 361/277
(58) Field of Search ............................. 331/36 C, 177 V; 334/80, 81, 82, 65, 88, 78; 361/278, 277, 271, 287, 290, 281

(56) References Cited

U.S. PATENT DOCUMENTS 5,061,049 * 10/1991 Hornbeck ........................... 359/224
5,894,091 * 4/1999 Kubota ............................. 73/504.2

OTHER PUBLICATIONS

Yao et al., "High Tuning–Ratio MEMS–Based Tunable Capacitors for RF Communications Applications," Tech. Dig., pp. 124–127, Solid–State Sensor and Actuator Workshop, Jun. 8–11, 1998, Hilton Head Island, South Carolina.
Young et al., "A Low–Noise RF Voltage–Controlled Oscillator Using On–Chip High–Q Three–Dimensional Coil Inductor and Micromachined Variable Capacitor," Tech. Dig., pp. 128–131, Solid–State Sensor and Actuator Workshop, Jun. 8–11, 1998, Hilton Head Island, South Carolina.
Fan et al., "Universal MEMS Platforms for Passive RF Components: Suspended Inductors and Variable Capacitors," IEEE Proc., pp. 29–33, Eleventh Annual Int'l. Conf. MEMS, Jan. 25–29, 1998, Heidelberg, Germany.
Doc et al., "Micromachined Varactor with Wide Tuning Range," Elec. Lett. Online No.: 19970628 (Apr. 7, 1997).
Young et al., "A Micromachined Variable Capacitor for Monolithic Low–Noice VCOS," Tech. Dig., pp. 86–89, Solid State Sensor and Actuator Workshop, Jun. 3–6, 1996, Hilton Head, South Carolina.

* cited by examiner

Primary Examiner—Robert Pascal
Assistant Examiner—Kimberly E Glenn
(74) Attorney, Agent, or Firm—DeMont & Breyer, LLC; Wayne S. Breyer; Jason Paul DeMont

(57) ABSTRACT

An article comprising a multi-port variable capacitor is disclosed. In one embodiment, a movable plate is suspended above at least a first and a second, fixed, electrically-isolated electrode. The first electrode is electrically connected to a bias supply, and the second electrode is electrically connected to an AC signal-carrying line. As bias is applied across the first electrode and the movable plate, an electrostatic attraction is developed therebetween that causes the movable plate to move downwardly towards the first electrode. The capacitance of the variable capacitor increases as the separation distance between the movable plate and the fixed electrodes decreases. Unlike conventional variable capacitors, in the present multi-port variable capacitors, the bias (delivered via the first electrode) and the signal (delivered via the second electrode) are electrically isolated from one another. As such, the bias (DC) and signal (AC) paths are advantageously electrically isolated. In an additional embodiment, the movable plate of the present variable capacitor is operable to tilt. The ability to tilt provides additional "signal processing" (i.e., logic) capabilities to the present multi-port variable capacitors. In additional embodiments, an article in accordance with the present teachings comprises a monolithically-integrable, tunable LC circuit, and a variable-frequency oscillator. In such LC circuits and oscillators, the multi-port variable capacitor described herein is used to tune the resonant frequency of the circuit.

18 Claims, 12 Drawing Sheets

ARTICLE COMPRISING A MULTI-PORT VARIABLE CAPACITOR

FIELD OF THE INVENTION

The present invention relates generally to a micromachined variable capacitor.

BACKGROUND OF THE INVENTION

Monolithic implementations of many desirable and important circuits have been hitherto unrealizable, or at least commercially impractical, due to the difficulty in fabricating low loss, expensive, linear passive RF components using conventional fabrication methods. That problem is being addressed, with some success, using microelectromechanical systems (MEMS) technology. Using MEMS technology, devices having the functionality of inductors, variable inductors and variable capacitors can be realized by various silicon IC-compatible, micron-sized electromechanical structures. The latter component, variable capacitors, are important elements of a variety of electrical circuits including variable-frequency oscillators, tuned amplifiers, parametric amplifiers, phase shifters, equalizers, and impedance-matching circuits, to name just a few.

Variable capacitors are devices in which a change in a control voltage charge or current causes a change in capacitance. One well known implementation of the variable capacitor is the varactor, typically realized as a p-n junction diode. In such a varactor diode, changes in the control voltage can yield up to about a factor of 10 change in capacitance. Diode varactors typically have two ports; an input port and an output port. As a two-port device, diode varactors have limited functionality. In particular, the two signals that are fed to the varactor—a DC bias and an AC signal—are received at the input port. The DC bias sets the capacitance of the varactor diode, while the AC signal is the signal being processed in the circuit that includes the varactor. If both signals are AC, mixing non-linearity disadvantageously occurs such that the response of the varactor to the control signal is non-linear. Moreover, such a two port arrangement disadvantageously introduces DC into the AC signal path.

The aforementioned limitation (i.e., only two-ports) of diode-based varactors has been carried over to most MEMS-based variable capacitors that have been proposed to date. FIG. 1 depicts a simplified schematic of a first MEMS-based variable capacitor 102 in the prior art. Such a variable capacitor typically consists of two parallel plates, 104 and 106. One of the two plates is non-movable. In conventional MEMS-based variable capacitor 102, the non-movable plate is lower plate 106, which is disposed on support or substrate 100. The other of the two plates, upper plate 104 in the present example, is movable. Upper plate 104 is typically suspended over non-movable lower plate 106, such as by beams or suitably arranged hinged plates (not shown).

The two plates are electrically connected to a bias supply (not shown) operable to apply a typically DC bias voltage, $V_1$, to variable capacitor 102. The two plates are also electrically connected to signal line 110 for supplying a signal, S, typically AC, to variable capacitor 102. As bias $V_1$ is applied across upper and lower plates 104 and 106, upper plate 104 moves towards fixed lower plate 106. The capacitance of variable capacitor 102 thereby increases. See, Young et al., "A Micromachined Variable Capacitor for Monolithic Low-Noise VCOs," Tech. Digest, pp. 86–89, 1996 Solid State Sensor and Actuator Workshop, Hilton Head Island, S.C., Jun. 3–6, 1996.

FIG. 2 depicts a simplified schematic of a second MEMS-based variable capacitor 202 in the prior art. Variable capacitor 202 has three parallel plates, including non-movable upper plate 206, non-movable lower plate 208 and movable plate 204. Movable plate 204 is sandwiched between the non-movable plates.

The plates are electrically connected to two bias sources (not shown), operable to apply bias voltages $V_1$ and $V_2$ to variable capacitor 202 as depicted in FIG. 2. The two plates are also electrically connected to signal line 210 for supplying a signal, typically AC, to variable capacitor 202. When bias $V_2$ is set to 0 volts and non-zero bias $V_1$ is applied, movable plate 204 moves upwardly towards non-movable upper plate 206, increasing the capacitance of variable capacitor 202. When bias $V_1$ is set to 0 volts and non-zero bias $V_2$ is applied, movable plate 204 moves downwardly towards non-movable lower plate 208, decreasing the capacitance of variable capacitor 202. The three-plate MEMS-based variable capacitor 202 is described, by its inventors, to provide an increased tuning range over a two plate MEMS-based variable capacitor, such as variable capacitor 102. See, A. Dec et al. in "Micromachined Varactor with Wide Tuning Range," Elec. Lett. Online No. 19970628 (Apr. 7, 1997).

In both of the conventional MEMS-based variable capacitors 102 and 202, the bias ($V_1$ and $V_1/V_2$) and signal (110 and 210) are not electrically isolated (i.e., they are applied to the same port). Being two-port devices, MEMS-based variable capacitors 102 and 202 disadvantageously share some of the limitations, such as those described above, common to conventional diode varactors.

The art would thus benefit from a MEMS-based variable capacitor having more than two ports. Such a device would provide a hitherto unachieved degree of flexibility and utility in comparison with conventional diode- or MEMS-based variable capacitors.

SUMMARY OF THE INVENTION

An article comprising a multi-port variable capacitor is disclosed. In one embodiment, the present article comprises a movable plate that is suspended above first and second coplanar fixed electrodes. A bias supply is electrically connected to the first electrode and the movable plate so that a bias $V_1$ can be applied to the multi-port variable capacitor. An AC signal-carrying line is electrically connected to the second electrode and the movable plate. As bias $V_1$ is applied, an electrostatic attraction is developed therebetween. Such an attraction causes the movable plate to move downwardly towards the first electrode. As it does so, the separation distance between the movable plate and the fixed electrodes decreases, so that the capacitance of the variable capacitor increases.

Unlike conventional variable capacitors, in some embodiments of the present multi-port variable capacitors, the bias (delivered via the first electrode) and the signal (delivered via the second electrode) are electrically isolated from one another. Since DC and AC are not mixed, a true AC-circuit design can be developed. In other words, the circuit can be designed without regard to the presence of DC, since none will be present. Moreover, the present multi-port variable capacitor can be made to operate in a substantially more linear fashion than conventional variable capacitors. More particularly, since the control signal and the RF signal are on separate ports, electrodes can be suitably designed such that the RF signal will not contribute to a change in the capacitance of the device. Also, mechanical advantage can be used to induce considerable capacitance change for relatively moderate applied voltage at the control terminals.

In some embodiments, the present variable capacitor is structured in such a manner that the movable plate is capable of "tilting." The ability to tilt increases the utility and functionality of the present variable capacitors. In particular, such "tilting" multi-port variable capacitors are advantageously capable of performing "signal processing" (i.e., logic) functions, such as addition, subtraction, multiplication and comparison functions.

In additional embodiments, an article in accordance with the present teachings comprises a monolithically-integrable, tunable LC circuit. In such LC circuits, the multi-port variable capacitor described herein is used to tune the resonant frequency of the circuit. Such LC circuits are used, in some embodiments, to create a variety of tunable filters. In a further embodiment, an article in accordance with the present teachings comprises a variable-frequency oscillator that incorporates a tunable LC circuit.

BRIEF DESCRIPTION OF THE DRAWINGS

FIGS. 10b–10g depict steps in the fabrication of a multi-port variable capacitor of FIG. 10a.

DETAILED DESCRIPTION

Figure 1:
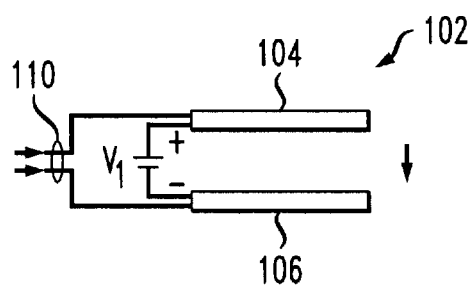
FIG. 1 depicts a first embodiment of a conventional MEMS-based variable capacitor.
Figure 2:
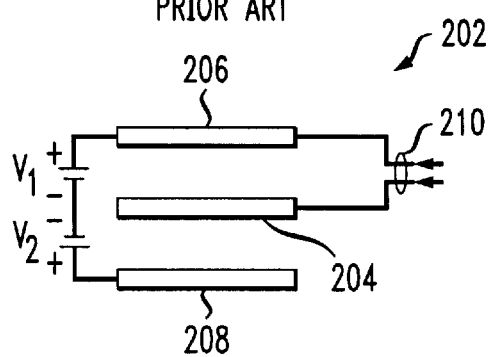
FIG. 2 depicts a second embodiment of a conventional MEMS-based variable capacitor.
Figure 3:
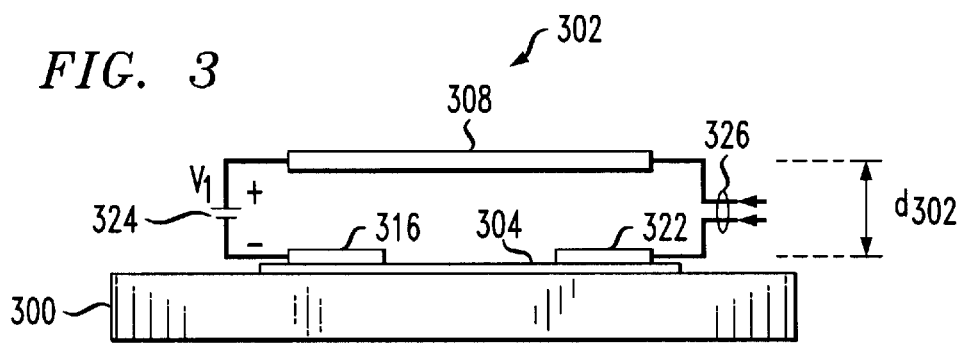
FIG. 3 depicts a simplified schematic of a first embodiment of a multi-port variable capacitor in accordance with the present teachings.

FIG. 3 depicts a simplified schematic of a multi-port variable capacitor 302 in accordance with the present teachings. Multi-port variable capacitor 302 includes movable plate 308 that is supported above two fixed electrodes, identified as first electrode 316 and second electrode 322. The fixed electrodes are disposed on electrically insulating layer 304 that is located on substrate 300. Support elements (not shown) suitable for supporting movable plate 308 over fixed first and second electrodes 316 and 322 are described later in this specification in conjunction with FIGS. 9a and 9b.

Figure 4:
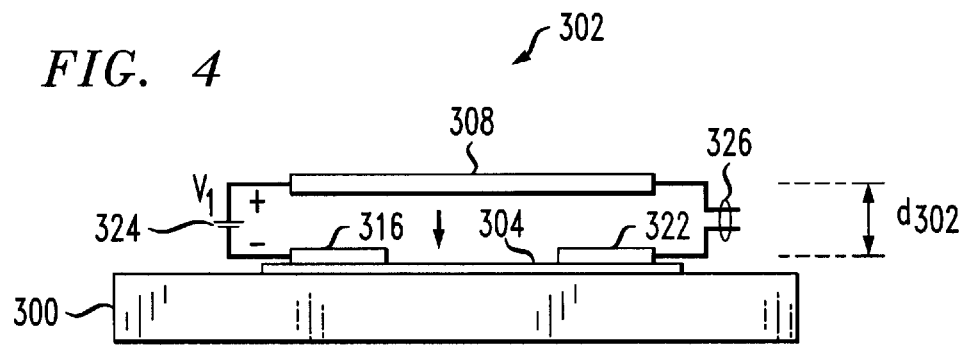
FIG. 4 depicts the multi-port variable capacitor of FIG. 3 under bias.

In illustrative capacitor 302, DC bias supply 324 is electrically connected across first electrode 316 and movable plate 308 to apply bias $V_1$ to the variable capacitor 302. AC signal-carrying line 326 is electrically connected to multi-port variable capacitor 302 across second electrode 322 and movable plate 308. Referring now to FIG. 4, as bias $V_1$ is applied across movable plate 308 and first electrode 316, an electrostatic attraction is developed therebetween. Such an attraction causes plate 308 to move downwardly towards first electrode 316. As separation distance, $d_{302}$, between the movable plate 308 and fixed electrodes 316, 322 decreases, the capacitance of variable capacitor 302 increases.

In multi-port variable capacitor 302, the bias (delivered via first electrode 316) and the signal (delivered via second electrode 322) are electrically isolated from one another. Since DC and AC are not mixed, a true AC-circuit design can be developed. Moreover, by virtue of such electrical isolation, some embodiments of the present multi-port variable capacitor operate in a substantially more linear fashion than is achievable with conventional (2-port) variable capacitors in at least some circumstances (e.g., if the DC voltage is larger than the time average AC voltage).

While multi-port variable capacitor 302 includes only two fixed electrodes, it should be understood that in other embodiments, more electrodes are present. Furthermore, in some embodiments, electrically-isolated electrodes are disposed on movable plate 308 and a common electrode is located thereunder. In additional embodiments, electrically-isolated electrodes are disposed on movable plate 308, as well as underneath it, in the manner of first and second electrodes 316 and 322. In some embodiments having three or more electrodes, a first and second electrode are electrically connected to one another while a third electrode is electrically isolated therefrom.

In some embodiments, such as those depicted in FIGS. 5–8, the movable plate of the present variable capacitor is physically adapted to move in such a manner that a first distance between a first electrode and the movable plate is different from a second distance between a second electrode (or nth distance between a "nth" electrode) and the movable plate (hereinafter "tilt"). "Tilting" multi-port variable capacitors in accordance with the present teachings are advantageously capable of performing signal processing (i.e., logic functions), in addition to their basic capacitive function.

Figure 5:
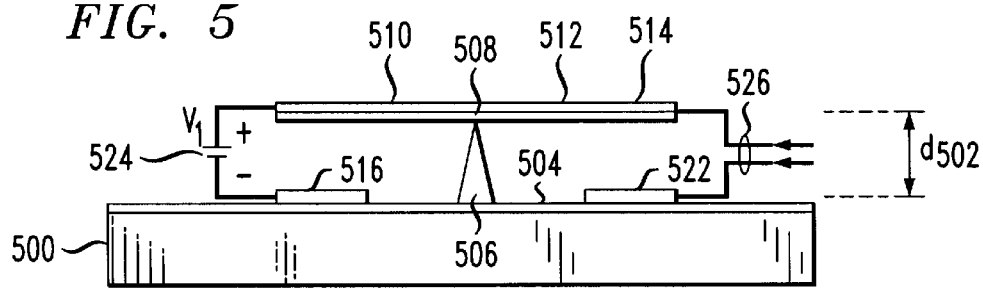
FIG. 5 depicts a simplified schematic of a first embodiment of a tilting multi-port variable capacitor in accordance with the present teachings.

FIG. 5 depicts a simplified schematic of a first embodiment of a tilting multi-port variable capacitor 502 in accordance with the present teachings. Illustrative multi-port variable capacitor 502 includes a plate 508 that is disposed on fulcrum 506. Fulcrum 506 "divides" plate 508 into first segment 510 and second segment 512, thus forming a bascule or "see-saw."

Plate 508 is formed of a conductive material, or is rendered conductive, such as by a layer 514 of metal that is disposed on plate 508. A first electrode 516 is located beneath first segment 510 of plate 508, and second electrode 522 is located beneath second segment 512 of said plate. First and second electrodes 516 and 522 are disposed on an electrically insulating layer 504 located on support 500.

In illustrative multi-port variable capacitor 502, DC bias supply 524 is electrically connected across first electrode 516 and first segment 510 of plate 508 for applying bias $V_1$ thereto. AC signal-carrying line 526 is electrically connected to multi-port variable capacitor 502 across second electrode 522 and second segment 512 of plate 508.

Figure 6:
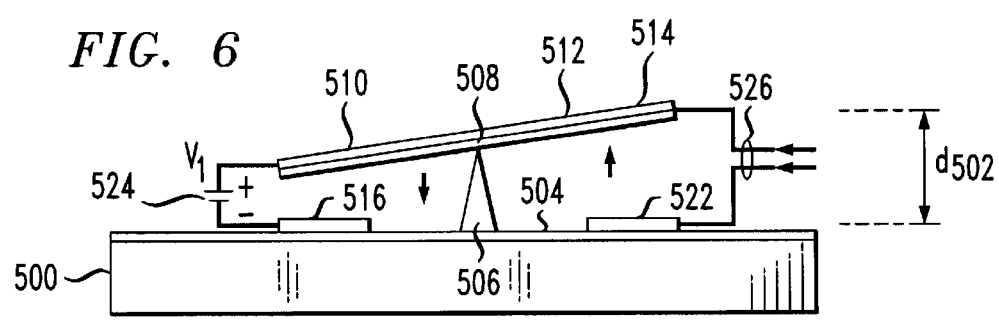
FIG. 6 depicts the multi-port variable capacitor of FIG. 5 under bias.

Referring now to FIG. 6, as bias $V_1$ is applied across first segment 510 of plate 508 and first electrode 516, an electrostatic attraction develops therebetween. Such an attraction causes first segment 510 to move downwardly towards first electrode 516. Due to the fulcrum 506, second segment 512 of plate 508 moves upwardly away from support 500 in response to the downward movement of first segment 510. Due to such movement, the separation distance, $d_{502}$, between second segment 512 of plate 508 and second electrode 522, changes. As separation distance $d_{502}$ changes, the capacitance associated therewith changes. In such a manner, the capacitance across plate 508 and second electrode 522 is controlled as a function of applied bias.

Figure 8:
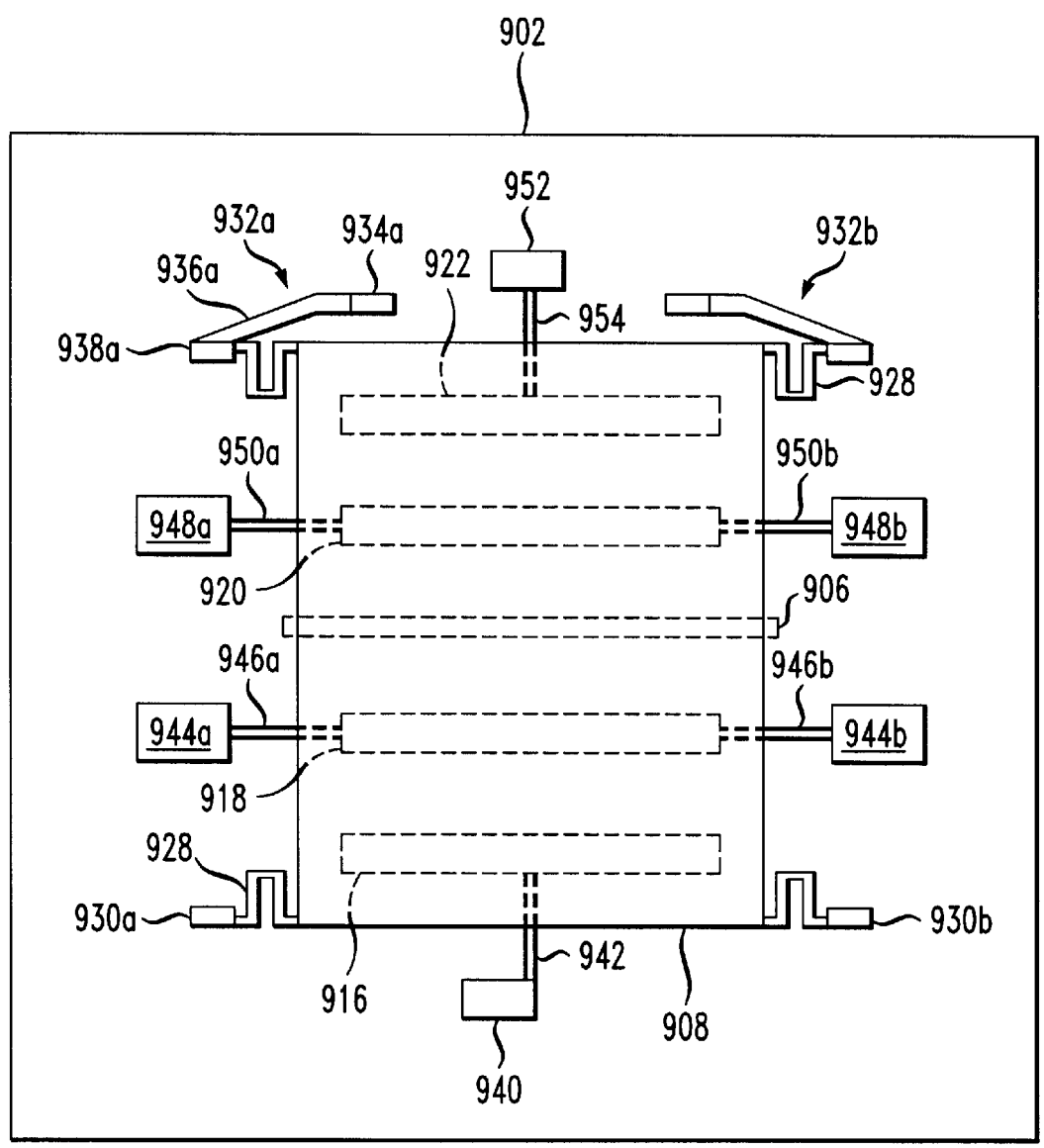
FIG. 8 depicts further detail of the capacitor of FIG. 7.
Figure 9A:
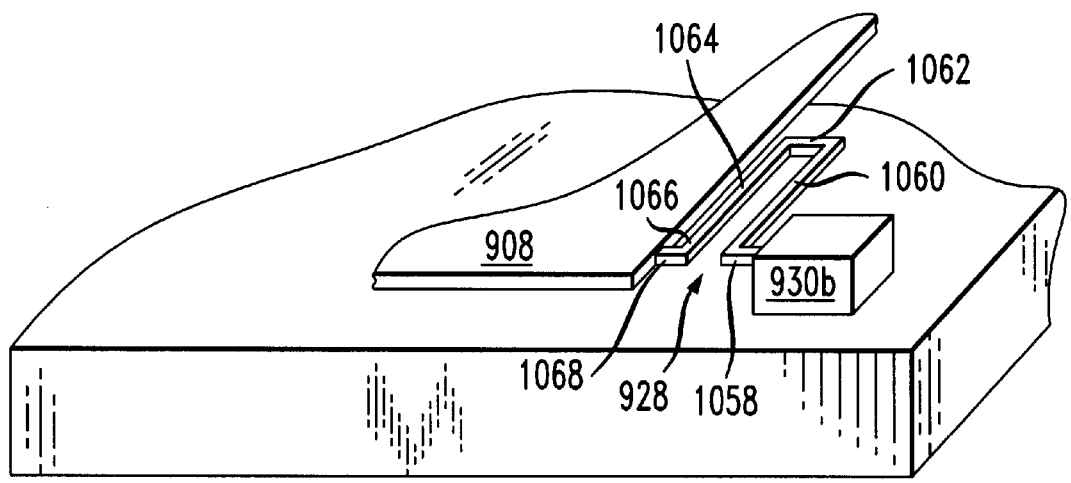
FIGS. 9a–b depict detail of a spring for use in conjunction with the present multi-port variable capacitors.
Figure 9B:
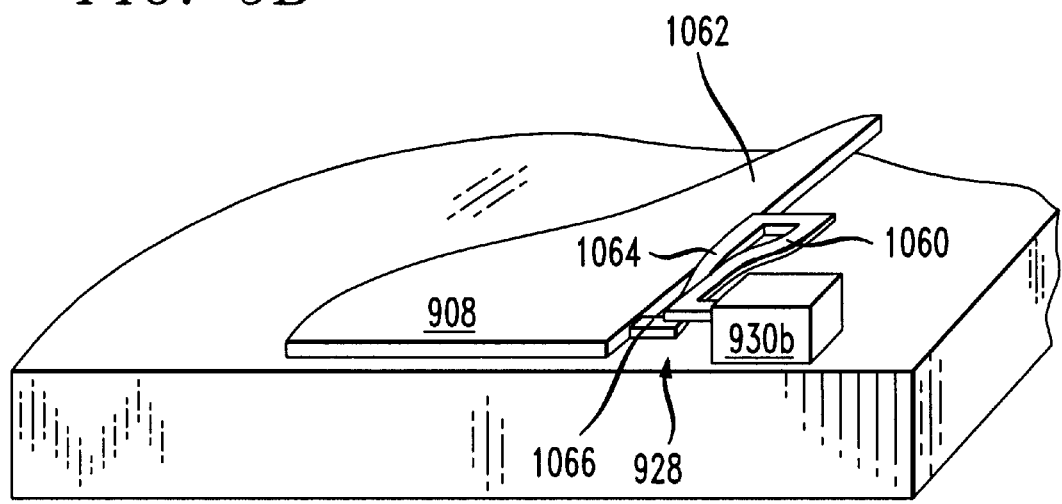

While the illustrated tilting multi-port variable capacitors are depicted as including a fulcrum and operating in the manner of a "see-saw," it should be understood that other arrangements for generating a "tilt" are contemplated for use in conjunction with the present invention. For example, in some embodiments, springs, such as those described later in this specification and depicted in FIGS. 8, 9a and 9b, are used to create a "tilt" in the movable plate. In such embodiments, springs are located away from the corners of the movable plate. As a voltage is applied across the movable plate and an electrode located thereunder, the plate will move towards the energized electrode. A spring nearest the energized electrode deforms in response to such movement, allowing substantially only such portion of the movable plate as is above the energized electrode to move downwards towards the energized electrode. Elsewhere, the movable plate may rise above its "neutral" position in response to such downward movement.

Moreover, the movable plate need not be configured as a rectangular or square. For example, in some embodiments, the movable plate has a triangular shape and is suitably supported by springs so that each corner of said plate can be individually biased towards an underlying electrode.

Figure 7:
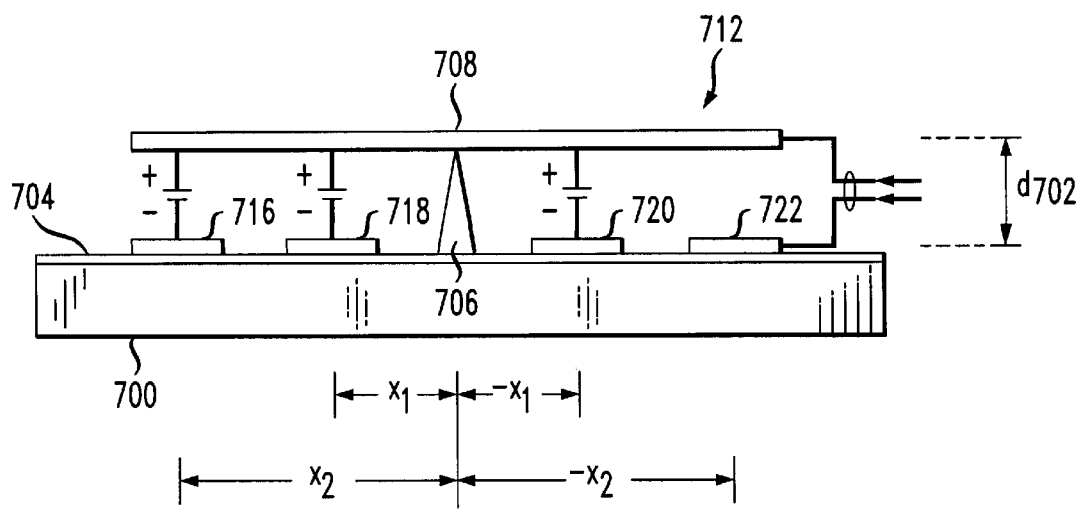
FIG. 7 depicts a simplified schematic of a second embodiment of a tilting multi-port variable capacitor in accordance with the present teachings.

As mentioned earlier in this specification, in some embodiments, the present variable capacitors have more than two electrodes. Such an embodiment is depicted in FIG. 7, which shows multi-port variable capacitor 702 having four electrodes 716, 718, 720 and 722, rather than two electrodes as in illustrative variable capacitor 502. First electrode 716 is disposed on electrically insulating layer 704 at a distance $x_2$ from fulcrum 706. Second electrode 718 is disposed on electrically insulating layer 704 at distance $x_1$ from fulcrum 706. Third electrode 720 and fourth electrode 722 are disposed on electrically insulating layer 704 at respective distances $-x_1$ and $-x_2$ from fulcrum 706.

As desired or necessary for a particular application, movable plate 708 can be formed from an insulating material. In one embodiment (not depicted), a strip of conductive material (e.g., metal) is disposed on top of movable plate 708 above electrodes 720 and 722. An electrically floating series connection is thereby provided between the capacitance created between each electrode and movable plate 708. A similar floating electrode disposed on top of movable plate 708 above electrodes 716 and 718 would provide a point of activation. Such an arrangement eliminates ground issues associated with a single conducting movable plate.

The presence, in variable capacitor 702, of such multiple electrodes provides additional functionality and utility in comparison with variable capacitor 502 or conventional variable capacitors. Among other attributes, due to the different positions of the electrodes relative to fulcrum 706, a different voltage-capacitance response is associated with each bias electrode. In other words, applying the same DC bias to electrodes 716 and 718 (at different times), results in a different separation distance, $d_{702}$, between, for example, second portion 712 of plate 708 and fourth electrode 722.

Moreover, such multiple electrodes provides a finer "tuning" ability to variable capacitor 702 than to variable capacitor 502. In particular, such a fine tuning ability is provided by applying bias to first and/or second electrodes 716, 718 on one side of fulcrum 706, and applying bias to third electrode 720 on the other side of fulcrum 706. In the illustrative embodiment, electrode 722 is reserved for the AC signal.

Additionally, tilting multi-port variable capacitors in accordance with the present teachings are advantageously capable of performing "signal processing" (i.e., logic) functions, such as by "comparing" the voltage(s) of signal(s) received on one side of fulcrum 706 with those received on the other side of fulcrum 706. The signal processing capabilities of the present variable capacitor, and signal processors based thereon, are described later in this specification.

FIG. 8 depicts a top view of a variable capacitor 902 configured in the manner of variable capacitor 702. Variable capacitor 902 illustrates further implementation details, in particular, an illustrative arrangement of wire bond pads or contacts for providing electrical connection to the various electrodes, as well as an illustrative embodiment of support members for, among other functions, supporting plate 908 above the various electrodes. Fulcrum 906 is disposed beneath plate 908.

Pads 930a/930b, and contacts 932a/932b provide electrical connection, via "springs" 928, to plate 908. Pad 940 provides electrical connection to first electrode 916 through wire trace 942. Pads 944a/944b provide electrical connection to second electrode 918 using respective wire traces 946a/946b. Pads 948a/948b provide electrical connection to third electrode 920 via respective wire traces 950a/950b. And pad 952 provides electrical connection to fourth electrode 922 using wire trace 954.

Contact 932a (and 932b ) for providing electrical connection to plate 908, includes a pad 934a that is electrically connected to a pad 938a via line 936a. A ground-signal-ground configuration is advantageously provided by the linear alignment of pads 934a, 934b and pad 952, wherein pads 934a, 934b flank pad 952. As is well known in the art, such a ground-signal-ground configuration provides guiding to a relatively high frequency signal (e.g., greater than about 10 GHz) being delivered to such contacts. Thus, illustrative variable capacitor 902 is configured for receiving a RF or microwave signal at pad 952 and contacts 932a or 932b. In other embodiments, pads 930a/930b, in conjunction with contact 940, provide a ground-signal-ground configuration, as well. Configuring the other contacts (i.e., pads 944a/b and 948a/b) to provide a ground-signal-ground arrangement is possible, although somewhat problematic, as longer electrical path lengths disadvantageously result.

Springs 928 suspend plate 908 over substrate 100 and, in conjunction with the contact pads, provide electrical connection thereto. Springs 928 are advantageously configured to (1) maintain plate 908 in a neutral position in the absence of applied bias or other signals, (2) deform to allow plate 908 to move relative to the support, and (3) provide a restoring force to plate 908 to return it to the neutral position from an energized position.

FIGS. 9a–9b depict further detail of spring 928 having a configuration suitable for achieving the above-described requirements. As shown in FIG. 9a, illustrative spring 928 has an elongated U-shaped configuration (when the plate it is supporting is in a neutral position). Member 1058 depending from first leg 1060 of spring 928 is connected to a contact pad, such as pad 930b of variable capacitor 902. Member 1068 depending from first end 1066 of second leg 1064 is connected to the movable plate, such as plate 908.

As depicted in FIG. 9b, second leg 1064 moves downwardly following the movement of plate 908, and draws first leg 1060 downwardly with it. About one half of the distance through which plate 908 drops toward an underlying electrode is accommodated by flexion in second leg 1064, and the other half is accommodated by flexion in first leg 1060. Energy is stored in spring 928 as the legs 1060 and 1064 move downwardly from their neutral position. Once the bias or other signal responsible for the movement of plate 908 away from its neutral position is removed, the energy stored in support 928 is released, returning plate 908, and spring 928 to the neutral position. Other configurations suitable for providing the resilience exhibited by spring 928 may suitably used for retuning plate 908 to a neutral position.

It is advantageous for mechanical support and electrical contact between the contact pads and the movable plate 908 to be effected via the same element. As such, springs 928 are advantageously electrically conductive or are rendered so, such as by the application of a metal thereto. As described below, a metal layer can readily be applied to spring 928 using conventional MEMS micromachining processes.

While dimensions of the present multi-port variable capacitors can vary significantly as suits a particular application, the larger contact pads, such as pad 940 depicted in FIG. 8, are typically about 100 microns along the long side, and plate 908 is typically about 400–600 microns square, or 400–600 microns along the long side of a rectangular plate, with the short side being about 200 microns.

Technology for fabricating a multi-port variable capacitor in accordance with the present teachings is available from a variety of sources, such as, for example, the MEMS Microelectronics Center of North Carolina (MCNC). One of the technologies offered by MCNC is a three-polysilicon-layer surface micromachining process. The lowest layer, referred to as "POLY0," is non-releasable and is used for patterning address electrodes and local wiring on a substrate, such as a silicon wafer. The upper two polysilicon layers, referred to as "POLY1" and "POLY2," are releasable and so can be used to form mechanical structures. Such release is achieved by etching away sacrificial oxide layers deposited between the polysilicon layers during fabrication. The polysilicon layers POLY0, POLY1 and POLY2 have nominal thicknesses of 0.5, 2.0 and 1.5 microns, respectively. The polysilicon and oxide layers are individually patterned, and unwanted material from each layer is removed by reactive ion etching before the next layer is added. Optionally, a layer of metal, nominally 0.6 microns in thickness, may be deposited on the POLY2 layer.

Figure 10A:
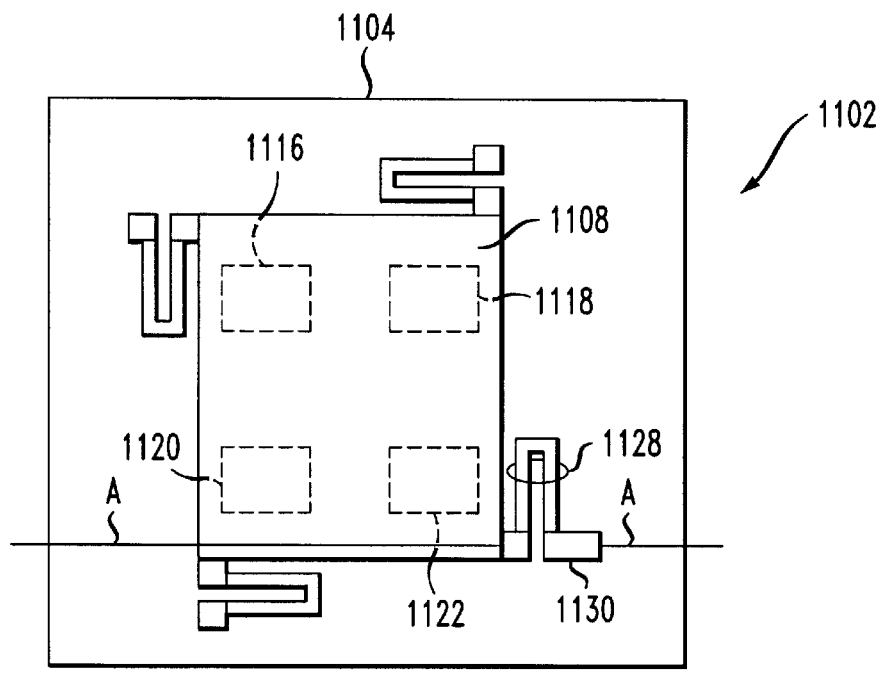
FIG. 10a depicts a multi-port variable capacitor in accordance with the present teachings.

FIGS. 10b–10g depict, via cross section thru line A—A, various steps in the fabrication of multi-port variable capacitor 1102, depicted in FIG. 10a. Multi-port variable capacitor 1102 comprises movable plate 1108 suspended by springs 1128 depending from contact pad or anchor 1130. Four fixed electrodes 1116, 1118, 1120 and 1122 are disposed beneath movable plate 1108 on non-electrically conductive layer 1104. For clarity of illustration, contacts to the fixed electrodes are not shown.

Figure 10B:
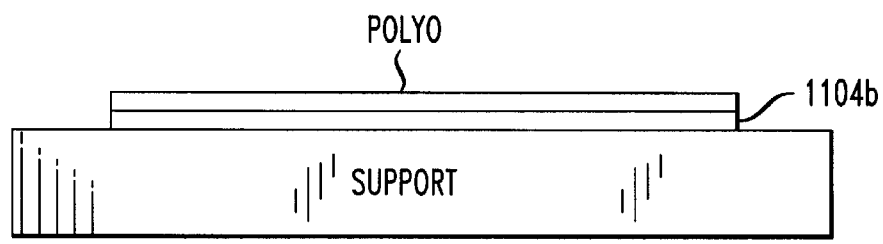
Figure 10C:
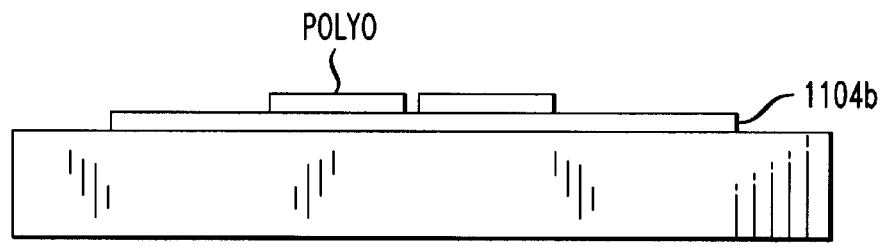

As depicted in FIG. 10b, a layer 1104b of non-electrically conductive material is disposed on a support and a first layer POLY0 of polysilicon is deposited on the layer 1104b. Layer POLY0 is patterned as indicated in FIG. 10c. Layer POLY0 is patterned into four regions, only two of which are shown in the cross section, that will form the four electrodes 1116, 1118, 1120 and 1122.

Figure 10D:
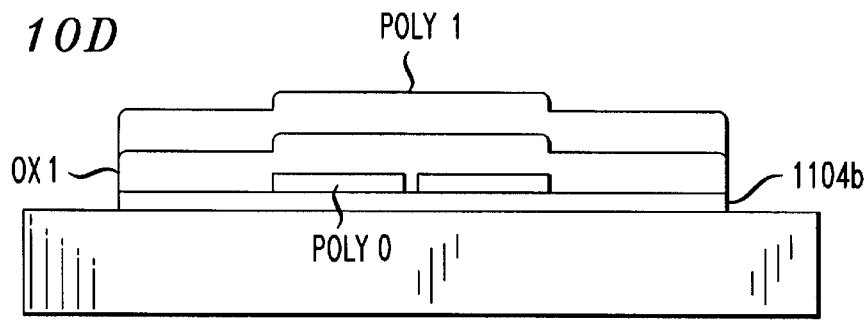
Figure 10E:
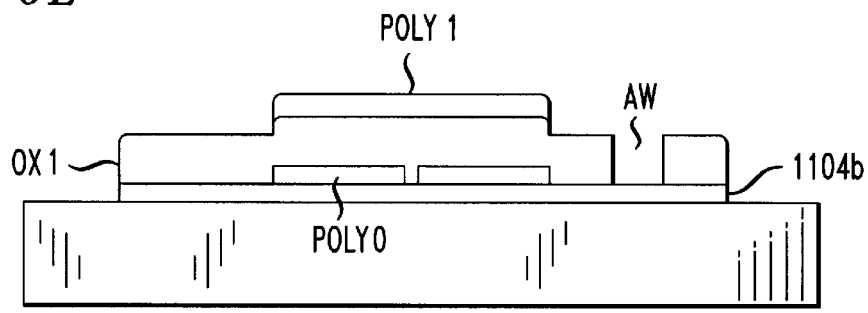
Figure 10F:
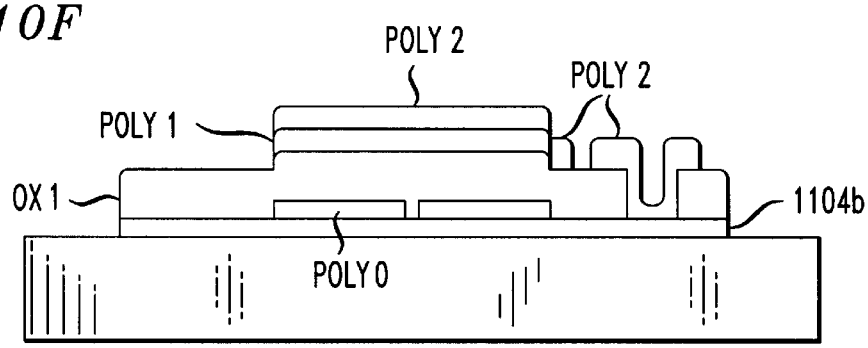

As depicted in FIG. 10d, a sacrificial layer OX1 of oxide is deposited on the patterned layer POLY0, and a second layer POLY1 of polysilicon is deposited on layer OX1. In a later step, oxide layer OX1 is completely removed to "release" movable plate 1108 and springs 1128. Layer POLY1 is patterned, as shown in FIG. 10e, to form the lower of two layers that collectively form movable layer 1108. An anchor way AW is patterned through layer OX1 so that the final polysilicon deposition will be partially "anchored" to layer 1104b and, by extension, to the substrate. FIG. 10f depicts a third layer POLY2 of polysilicon after deposition and patterning on layer POLY1. As patterned, layer POLY2 forms springs 1128, anchor 1130, and the upper layer of movable layer 1108.

Figure 10G:
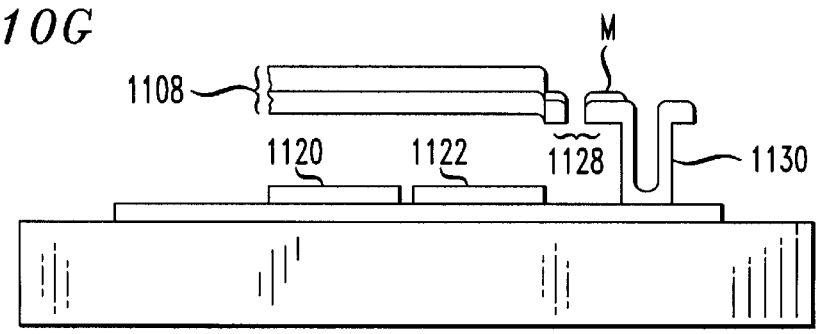

FIG. 10g shows variable capacitor 1102 after movable layer 1108 is "released" (i.e., oxide layers are removed). A layer M of metal is deposited on springs 1128 and a portion of anchor 1130 since the anchor and springs provide electrical contact to movable layer 1108.

Figure 11A:
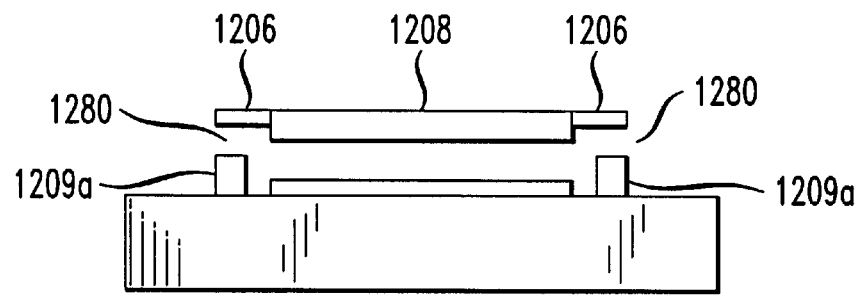
FIG. 11a depicts a first embodiment of a fulcrum and support for a tilting multi-port variable capacitor in accordance with the present teachings.

Fulcrums, such as fulcrum 506 of "tilting" multi-port variable capacitor 502, may be implemented in a variety of ways using MEMS technology. FIG. 11a depicts a first implementation wherein a fulcrum is realized as freely pivoting pin 1206 depending from movable layer 1208. Pin 1206 is supported by support 1209a. A gap 1280 is shown between pin 1206 and support 1209a. Such a gap 1280 is required to fabricate a freely pivoting pin. In the absence of such a gap, the "torsional spring" described below results. When using MCNC's three-layer process, pin 1206 and movable layer 1208 can be fabricated from the third polysilicon layer, POLY2, while support 1209a is fabricated from layer POLY1 and fixed electrodes are fabricated from layer POLY0.

In an alternative embodiment, not depicted, a "torsional spring" is used rather than a pivoting pin. Such a torsional spring can be fabricated by securing a pin, such as pin 1206, to support 1209a. When the pin is fixed in such a manner, it cannot roll or pivot in the manner of pin 1206 as one side of the movable plate is drawn downwardly. Rather, as an energized electrode draws one of the sides of the movable plate downward, the torsional springs twists, storing energy. As the electrode is de-energized, the stored energy is released returning the movable plate to a neutral position.

Figure 11B:
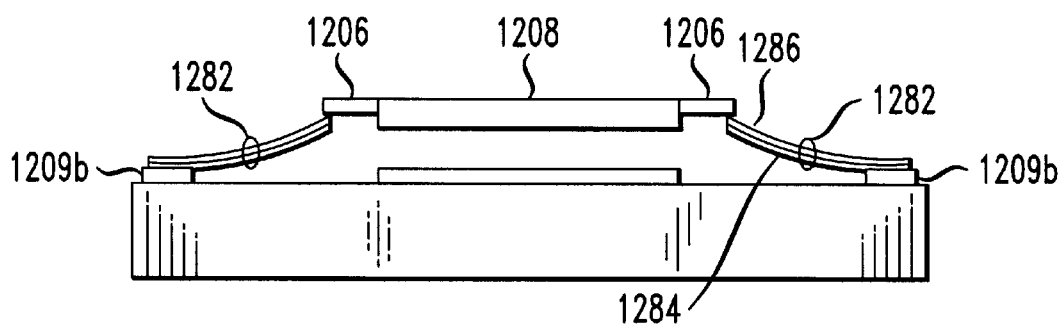
FIG. 11b depicts a second embodiment of a fulcrum and support for a tilting multi-port variable capacitor in accordance with the present teachings.

In a further embodiment, illustrated in FIG. 11b, a self-assembling "warped" plate 1282 is used as a support for supporting a pivoting pin 1206. As described below, using such a warped plate eliminates fabrication gap 1280 that is required in the embodiment depicted in FIG. 11a. By eliminating fabrication gap 1280, pivoting begins with a very small applied voltage. If gap 1280 is present, movable plate 1208 must first be pulled downwardly, via the application of voltage, reducing the gap between the movable plate and the underlying electrode on both sides of the pivot. Movable plate 1208 is pulled downwardly towards the underlying electrode until pin 1206 abuts supports 1209a. Once pin 1206 contacts supports 1209a, movable plate 1208 continues to drop towards the electrode on the "pulling" or biased side, and rises on the opposite side of the fulcrum. While in some embodiments it is preferable to avoid a fabrication gap, in others, such a gap is desirable, as a function of the intended application.

Like the embodiment depicted in FIG. 11a, pivoting pin 1206 and movable plate 1208 are fabricated from the third polysilicon layer POLY2, and support 1209b is fabricated from the second polysilicon layer POLY1. Warped plate 1282 comprises two layers, a lower layer 1284 fabricated from the layer POLY2, and an upper layer 1286 of material having a high intrinsic stress. Metals, such as gold, can be used for such purpose. When sacrificial silicon dioxide layers (not shown) are etched away to release movable layer 1208 and the warped plate 1282, metal layer 1286 contracts to minimize stress. Upon such contraction, an upwardly-directed force is imparted to the free end of warped plate 1282.

In one embodiment, a thin "adhesion" layer (not shown) is deposited on the structural (e.g., polysilicon) layer POLY2. The adhesion layer comprises a material, such as chromium, that adheres well to the overlying conductive layer, and adheres better to the underlying structural layer than does the conductive layer. The adhesion layer, rather than the conductive layer, is deposited with a high level of intrinsic stress, and contracts to minimize strain upon release. Other methods of self- or guided assembly, such as may occur to those skilled in the art, may be used in conjunction with the present invention.

It was mentioned earlier in this specification that a "tilting" multi-port variable capacitor in accordance with the present teachings can function as a basic "logic" device and signal processor. Such embodiments will now be described.

Figure 12:
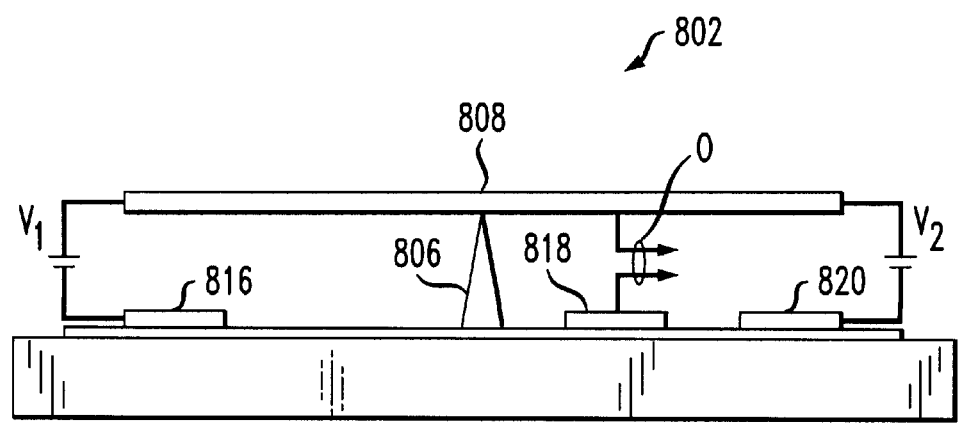
FIG. 12 depicts a simplified schematic of a logic circuit in accordance with an illustrated embodiment of the present invention.

FIG. 12 depicts a simplified schematic of device 802 comprising a variable capacitor that functions as a basic logic circuit or switching circuit in accordance with an illustrated embodiment of the present invention. Device 802 includes plate 808 disposed on fulcrum 806. Electrodes 816 and 820 are disposed on opposite sides of and equidistant from fulcrum 806. An additional electrode 818 is disposed between electrodes 816 and 820. While in illustrative embodiment depicted in FIG. 12, electrode 818 is disposed closer to electrode 820 than electrode 816, in other embodiments, electrode 818 is disposed closer to electrode 816.

Device 802 is electrically connected to a first signal source (not shown) operable to apply a signal $V_1$ across electrode 816 and plate 808. Device 802 is also electrically connected to a second signal source (not shown) operable to apply a signal $V_2$ across electrode 820 and plate 808. Further, device 802 has an output O, which is a signal generated at electrode 818.

A truth table for device 802 is provided below in TABLE 1:

TABLE 1

| O | $V_1$ | $V_2$ |
|---|---|---|
| 0 | 1 | 1 |
| 0 | 0 | 0 |
| 1 | 1 | 0 |
| 1 | 0 | 1 |

If $V_1$ and $V_2$ both have a logic state of 1, or of 0, then plate 808 remains in its neutral position and output O has a logic state of 0. If $V_1$ has a logic state of 1, and $V_2$ has a logic state of 0, then plate 808 will move downwardly towards electrode 820. As it so moves, a change in capacitance is detected across electrode 818 and plate 808, and output O has a logic state of 1. If $V_1$ has a logic state of 0, and $V_2$ has a logic state of 1, then plate 808 will move downwardly towards electrode 820. With such downward movement, a change in capacitance is again detected across electrode 818 and plate 808, and output O has a logic state of 1.

As compared to conventional logic circuits, the present multi-port variable capacitor, when implemented as a logic circuit, is expected to advantageously (1) have lower power consumption, (2) provide the ability to perform such logic with high frequency signals, and (3) reduce the complexity of logic circuits.

It should be understood that the above-described logic circuit is a very basic embodiment; numerous and varied other arrangements of the present multi-port variable capacitor useful for other logic applications and for providing additional functions are possible. Such arrangements, as will occur to those skilled in the art in view of the present teachings, may suitably be used in conjunction with, and are within the intended scope of, the present invention. For example, the signal required to draw the movable plate down is significantly smaller than the signal (voltage) required to hold the movable plate down (since the gap between the movable plate and an underlying electrode is reduced). As such, memory, hysteresis, debouncing or crossover noise reduction can be "built in" to the present logic circuits. Moreover, if signals are not strong enough to completely pull the plate to rest on the electrode, a "partial" truth can be created and sensed.

In additional embodiments, the present logic circuit includes physical latches or catches such that the movable plate can be locked in position once it tilts, thereby providing "memory" if power is then removed.

Figure 13A:
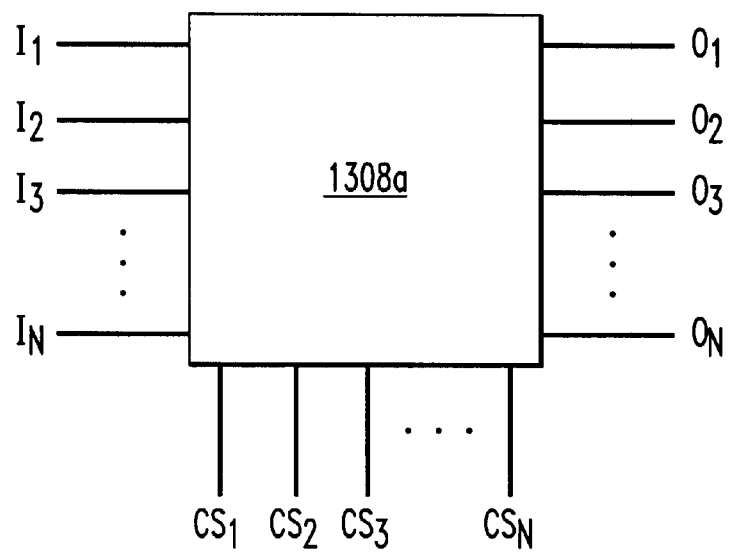
FIG. 13a is a conceptual depiction of a multi-port signal processor in accordance with the present teachings.

FIG. 13a is a simplified conceptual depiction of a signal processor 1302a in accordance the present teachings. Such a signal processor can be implemented as a "tilting" multi-port variable capacitor having a plurality of electrodes. Processor 1302a includes inputsh $I_{1 \ldots N}$, outputs $O_{1-N}$ and control signals $CS_{1-N}$ and has the capability of adding, subtracting, multiplying and comparing signals. The input, output and control signal lines are electrically connected to electrodes (not shown) disposed underneath movable plate 1308a. The particular arrangement of such electrical connections is dictated by the desired functionality of processor 1302a.

Figure 13B:
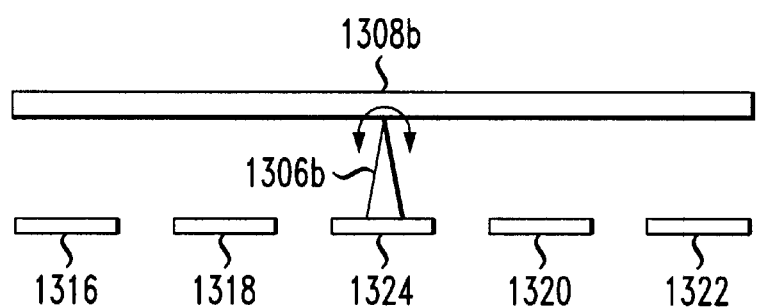
FIG. 13b depicts a simplified schematic of a multi-port signal processor in accordance with the present teachings.

The various signal processing functions mentioned above are illustrated in conjunction with FIG. 13b for an RF signal. FIG. 13b depicts signal processor 1302b including movable plate 1308b, fulcrum 1306b, and electrodes 1316 1318, 1324, 1320 and 1322. For clarity, the various input, output and control lines, and their interconnection with the electrodes, are not shown.

Signal processor 1302b provides a first functionality as a weighted or unweighted comparator. In such an application, a first RF signal is applied to electrode 1316 and a second RF signal is applied to electrode 1322. The RF signal having the greater RMS voltage will cause movable plate 1308b to be pulled towards the electrode to which that signal is applied. That signal is then conducted through movable plate 1308b to output electrode 1324. A read out of output electrode 1324 reveals the RF signal having the greater voltage.

Decision making can be "weighted" by, for example, providing different-sized electrodes, varying the spacing between the electrodes and fulcrumn 1306b, and varying the gap between the electrodes and the movable plate 1308b. For example, in signal processor 1302b, if the first RF signal is applied to electrode 1316, and the second RF signal is applied to electrode 1320, the decision will be weight towards the first RF signal due to the advantage provided by the longer lever arm (i.e., the distance between electrode 1316 and fulcrun 1306b is greater than the distance between electrode 1320 and fulcrum 1306b).

Hysteresis can be controlled by restricting the rotation of movable plate 1308b away from a neutral position to a relatively small amount. In some embodiments, springs or other elements capable of imparting a restoring force to movable plate 1308b to return it to a neutral position in the absence of a signal are provided.

Signal processor 1302b provides a second functionality of addition and subtraction. In the small-signal (ow-voltage) limit, with a restoring force imposed to return the plate to a neutral position, if multiple signals are applied to multiple electrodes on the same side of fulcrum 1308b, the time average of such signals are summed. For example, if two such low-voltage RF signals are applied to electrodes 1316 and 1318, the sum of the time average is read as a displacement at electrode 1322.

Signal processor 1302b provides a third functionality of multiplication when using higher-voltage RF signals. The multiplication functionality is illustrated via the following example. Assume that a signal S1 is applied to electrode 1316 and a signal S2 is applied to electrode 1318 on the left side of fulcrum 1306b, and the sum of signals S1 and S2 is applied to electrode 1322 on the right side of fulcrum 1306b. The force drawing movable plate 1308b towards electrodes 1316 and 1318 is <S1>$_2$+<S2>$_2$, where "<>" designates a time average. The force drawing movable plate 1308b towards electrode 1322 is given by <S1+S2>$_2$. The difference between the force drawing the movable plate towards the electrodes on the left side of the fulcrum and the force drawing the movable plate towards the electrodes on the right side of the fulcrum is <S1×S2>. The time-averaged product of the two signals can be sensed, by electrode 1320, as a displacement of the movable plate.

Signal processor 1302b provides a fourth functionality of operating as a feedback element. In an illustration of such a functionality, it assumed that electrode 1322 is incorporated in a LC circuit, such as is described later in this Specification. The resonant frequency of that LC circuit can be controlled in a feedback loop wherein an increase in a DC voltage on electrode 1316 increases the gap between electrode 1322 and movable plate 1308b, thereby decreasing the capacitance therebetween and increasing the resonant frequency of the LC circuit. Conversely, increasing a DC voltage on electrode 1320 decreases the gap between electrode 1322 and movable plate 1308b, thereby increasing the capacitance therebetween and decreasing the resonant frequency of the LC circuit.

Due to its small size and compatibility with CMOS processing, the present multi-port variable capacitors can advantageously be monolithically integrated into a number of important circuits using commercial-scale processing. At a most basic circuit level, the present multi-port variable capacitor can be used to provide an improved tunable LC circuit, such as is mentioned above. Such tunable LC circuits are used in variable frequency oscillators ("VFOs"), filters and other important circuits in wireless telecommunications and other applications, as is described further below.

Figure 14A:
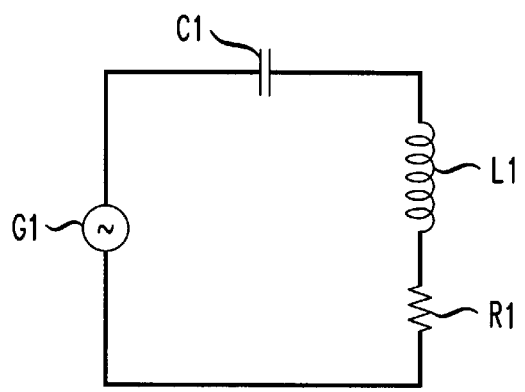
FIG. 14a depicts a series LC circuit.
Figure 14B:
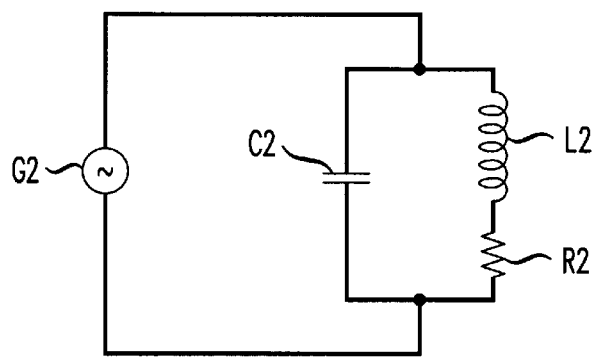
FIG. 14b depicts a parallel LC circuit.

FIGS. 14a and 14b depict, respectively, conventional series and parallel LC circuits. Such LC circuits, which are often referred to as "tank" circuits, consist, in a most basic embodiment, of an inductor and a capacitor. Series LC circuit 1100 includes power source G1, capacitor C1, inductor L1 and resistor R1, connected as shown. Parallel LC circuit 1200 includes the same elements (i.e., power source G2, capacitor C2, inductor L2 and resistor R2), but connected in a parallel configuration. Resistors R1 and R2 are not actual circuit elements, but are included to account for the inherent resistance of the circuit components, particularly the inductor.

When the magnitude of the impedance (or reactance) of the inductor and capacitor within either of the circuits are equal, that circuit is in resonance. The resonant frequency $f_r$ of an LC circuit, whether in series or parallel, is given by:

$$f_r = 1/(2\pi(LC)^{1/2}, \qquad [1]$$

where:

$f_r$ is the resonant frequency in Hertz;

L is the inductance in Henrys; and

C is the capacitance in Farads.

Given expression [1], it is clear that the resonant frequency of the circuit can be changed by changing the value of either L or C. Thus, by incorporating the present multi-port variable capacitor into such an LC circuit, the circuit is tunable. Tunable LC circuits are not new; however, the functionality, low cost, speed and CMOS compatibility of the present multi-port variable capacitors increases the utility of such circuits.

It is well known that LC circuits can be used in filter applications. Such applications are described in U.S. patent application No. 6,101,371, issued Aug. 8, 2000 incorporated by reference herein. The present variable capacitor can be used in the notch, pass and band pass filters described therein, as well as in other configurations.

In some embodiments of the present invention, a plurality of electrically-isolated capacitors of different values are advantageously constructed using a single movable plate. As the movable plate moves vertically, away from fixed electrodes, the capacitance of the plurality of capacitors changes by the same relative amount. In embodiments in which the movable platform is tiltable by virtue of a fulcrum, the capacitance of capacitors fabricated on one side of the fulcrum increases, and the capacitance of capacitors fabricated on the other side of the fulcrum decreases. Thus, by appropriately constructing the movable platform and location of the fixed electrodes, the capacitance of each capacitor can be tailored in such a way as to get a desired cooperative effect of all capacitors in a filter constructed of resonant LC circuits, so as to shift the band pass of the filter.

Figure 14C:
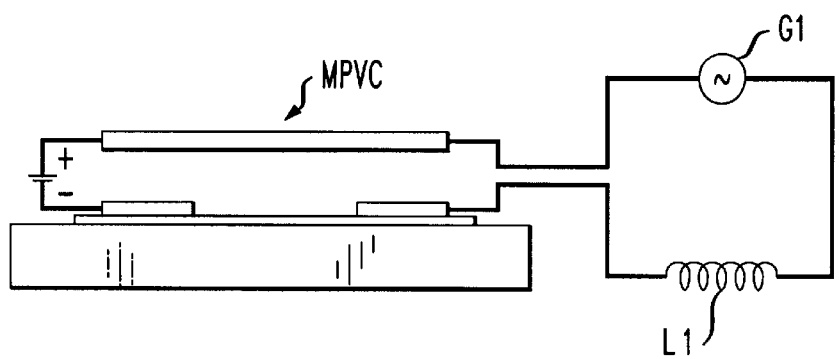
FIG. 14C depicts a tunable LC circuit in accordance with the present teachings.

A monolithically-integrable, CMOS-compatible, variable LC circuit in accordance with an illustrative embodiment of the present invention, which is depiced in FIG. 14C, advantageously includes a multi-port variable capacitor MPVC as described herein, fixed inductor L1, such as a regular CMOS inductor or a MEMS-based fixed inductor such as is described in U.S. patent application No. 6,101,371, and power source G1.

As previously mentioned, LC circuits are important elements of more complicated devices, including, for example, VFOs In a further embodiment of the present invention, the CMOS compatible, monolithically-integrable LC circuits previously described can be used to form a monolithically-integrable VFO. Rather than depicting specific VFO layouts, generic layouts suitable for use in conjunction with the present invention are described below. In application of the guidelines provided herein and well understood principles of oscillator design, those skilled in the art will be able to configure VFOs in accordance with the present teachings in a wide variety of ways as suits a particular application.

The present VFOs are radio-frequency oscillators. An oscillator is a device or circuit that converts DC power to RF power. The present solid-state oscillators incorporate a non-linear active device, such as a diode or transistor, which is biased so as to be in an unstable, "negative-resistance" regime. The phrase "negative resistance" is used to describe a process whereby energy is coupled into the resonant structure in a manner that allows the resonant structure to sustain rf oscillations, and is a requirement for producing net RF power.

Oscillation frequency of the oscillator is determined by load and terminating circuits, as well as by a frequency-selective network, often implemented as a resonant structure which, in the present invention, includes an LC circuit comprising the present multi-port variable capacitor. By incorporating the present variable capacitor in such a circuit, the oscillation frequency of the oscillator is adjustable.

Additional functionality is provided by fabricating multiple variable capacitors using a single movable plate. If two frequencies are required in a circuit, and it is important for the ratio of those frequencies to remain constant, having two electrically-isolated electrodes beneath a single movable platform insures that the frequency-controlling capacitors formed by those electrodes will change by the same relative amount even if their initial magnitudes are different. If, on the other hand, it is desirable for multiple frequencies to change at different rates, electrodes placed at different distances from the fulcrum of a tilting multi-port variable capacitor can be used as the frequency-controlling elements.

Figure 15:
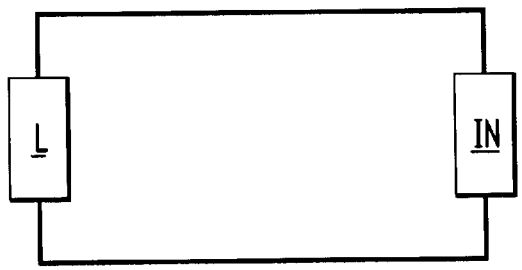
FIG. 15 is a conceptual depiction of a conventional one-port negative-resistance oscillator.

In one embodiment, an improved VFO in accordance with the present teachings utilizes the present multi-port variable capacitor in the well known configuration of a one-port negative-resistance oscillator. A one-port negative-resistance oscillator is conceptually depicted in FIG. 15. Such an oscillator can be conceptualized as including a load L and a negative-resistance input device IN. Typically, the negative resistance device is a Gunn or IMPATT diode, which is biased to create a negative resistance. In accordance with the present teachings, the load comprises a resonant structure, such as an LC circuit including the present multi-port variable capacitor.

Figure 16:
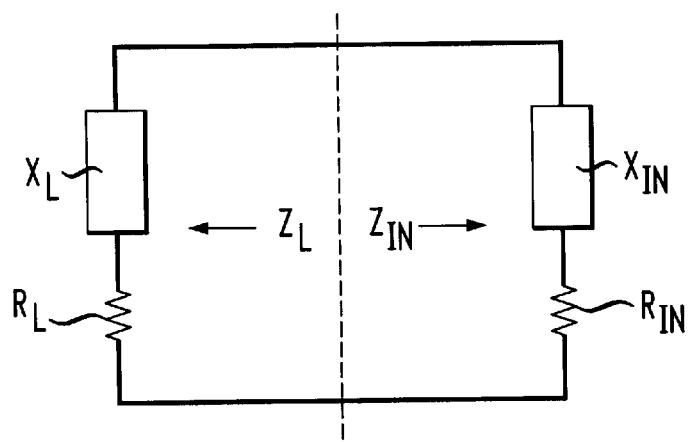
FIG. 16 depicts a model in which load L and input device IN of an oscillator are modeled by frequency dependent impedances $Z_L$ and $Z_{IN}$.

Load L and input device IN can be modeled by frequency dependent impedances $Z_L$ and $Z_{IN}$, as depicted in FIG. 16, wherein:

$$Z_L = R_L + jX_L,\qquad [2]$$

and $$Z_{IN} = R_{IN} + jX_{IN},\qquad [3]$$

where:
  $Z_L$ is the impedance of the load;
  $R_L$ is resistance of the load;
  j is the J operator$=(-1)^{0.5}$;
  $X_L$ is the reactance of the load; and
  $Z_{IN}$, $R_{IN}$, j and $X_{IN}$ are the corresponding quantities for input device IN.

It is well known that for oscillation to occur, the following equations must be satisfied:

$$R_L + R_{IN} = 0,\qquad [4]$$

and $$X_L + X_{IN} = 0.\qquad [5]$$

For a passive load, $R_L > 0$, so that expression [4] implies $R_{IN} < 0$. Negative resistive $R_{IN}$ is the energy source for the oscillator. Expression [5] sets the frequency of oscillation, as follows. When load L includes a variable capacitance:

$$X_L = X_L^{(4)} + X_C;\qquad [6]$$

where:
  $X_C$ is capacitive reactance; and
  $X_L^{(4)}$ is inductive reactance.

$$X_C = -1/(\omega C);\qquad [7]$$

and $$X_L = \omega L;\qquad [8]$$

where:
  ω is frequency;
  C is capacitance; and
  L is inductance.
Then, the frequency of oscillation $\omega_o$ is given by:

$$\omega_o = 1/[C(X_L^{(4)} + X_{IN})],\qquad [9]$$

As the magnitude of the function $-X_c$ determined by capacitance C changes, so does the frequency $\omega_o$ of the oscillator.

As is well known to those skilled in the art, oscillator design requires consideration of factors other than those described above, such as, for example, selection of an operating point for stable operation and maximum power output, frequency pulling, large signal effects and noise characteristics. Such factors are well understood by those skilled in the art, and will not be described herein.

Figure 17:
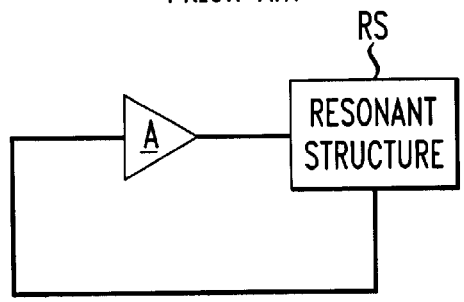
FIG. 17 depicts a conventional amplifier-based oscillator.

Another commonly used oscillator structure implements the function of negative-resistance using an amplification device. FIG. 17 depicts a conventional amplifier-based VFO. Such an oscillator includes a frequency-dependent or resonant structure RS and an amplification device A. The power output port can be on either side of amplification device A, which is commonly implemented as a transistor.

In an improved amplifier-based VFO in accordance with the present teachings, the resonant structure comprises an LC circuit including the present passive self-assembling inductor. In such a VFO, the amplifier is implemented such that it is operable, at an input, to monitor the rf signal in the resonant structure, and further operable, at an output, to inject an amplified signal into the resonant structure in a manner best suited to sustain oscillations in the resonant structure. Those skilled in the art will be able to design an amplification device suitable for providing the above-described functions.

As regards the commonly-employed transistor implementation of amplification device A, the configuration of the transistor in the oscillator depends, in large part, on the specifics of transistor. In particular, for FETs, common source or common gate configurations are typically used. For bipolar transistors, common emitter and common base configurations are more typical.

Figure 18:
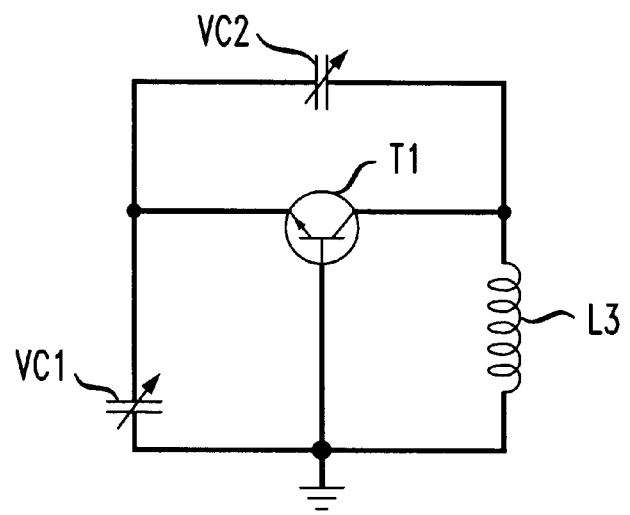
FIG. 18 depicts a simple Colpitts oscillator configuration.
Figure 19:
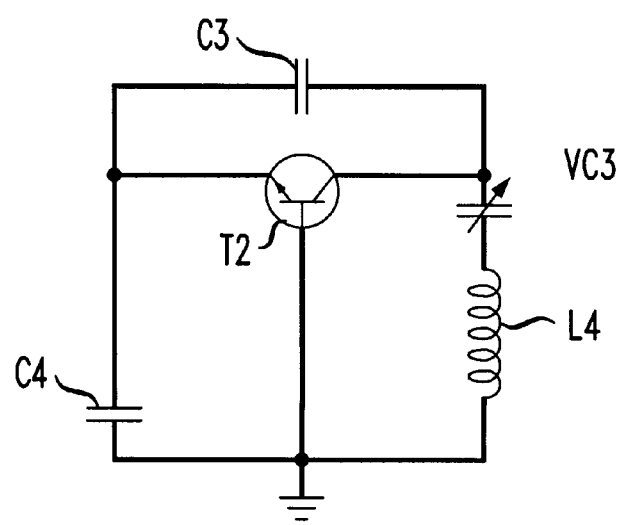
FIG. 19 depicts a simple Clapp oscillator configuration.

Two well-known configurations of a transistor-based negative-resistance one-port oscillator, both suitable for use in conjunction with the present invention, include the Colpitts oscillator, depicted in a very basic embodiment in FIG. 18, and the Clapp oscillator, depicted in a very basic embodiment in FIG. 19. Both oscillators are shown utilizing bipolar transistors as their amplification element in a common-base configuration.

In the embodiment depicted in FIG. 18, the Colpitts oscillator comprises two variable capacitors VC1 and VC2, transistor T1 and inductor L3, electrically connected as shown. While both capacitors are shown as variable capacitors, in other embodiments of a Colpitts oscillator, VC2 is replaced by a fixed capacitor. In the embodiment depicted in FIG. 19, the Clapp oscillator comprises two fixed capacitors C3 and C4, variable capacitor VC3, inductor L4 and transistor T2, electrically connected as shown. Improved versions of the basic Colpitts and Clapp oscillators incorporate the passive self-assembling inductors described herein.

While the more basic embodiments of the Colpitts and Clapp configurations typically use the small signal S parameter of the transistor, it should be understood that full simulation, including the large-signal response, is necessary for an optimized oscillator design.

Thus, the aforedescribed typical oscillators are improved in accordance with the present invention by incorporating the present multi-port variable capacitor therein.

Figure 20:
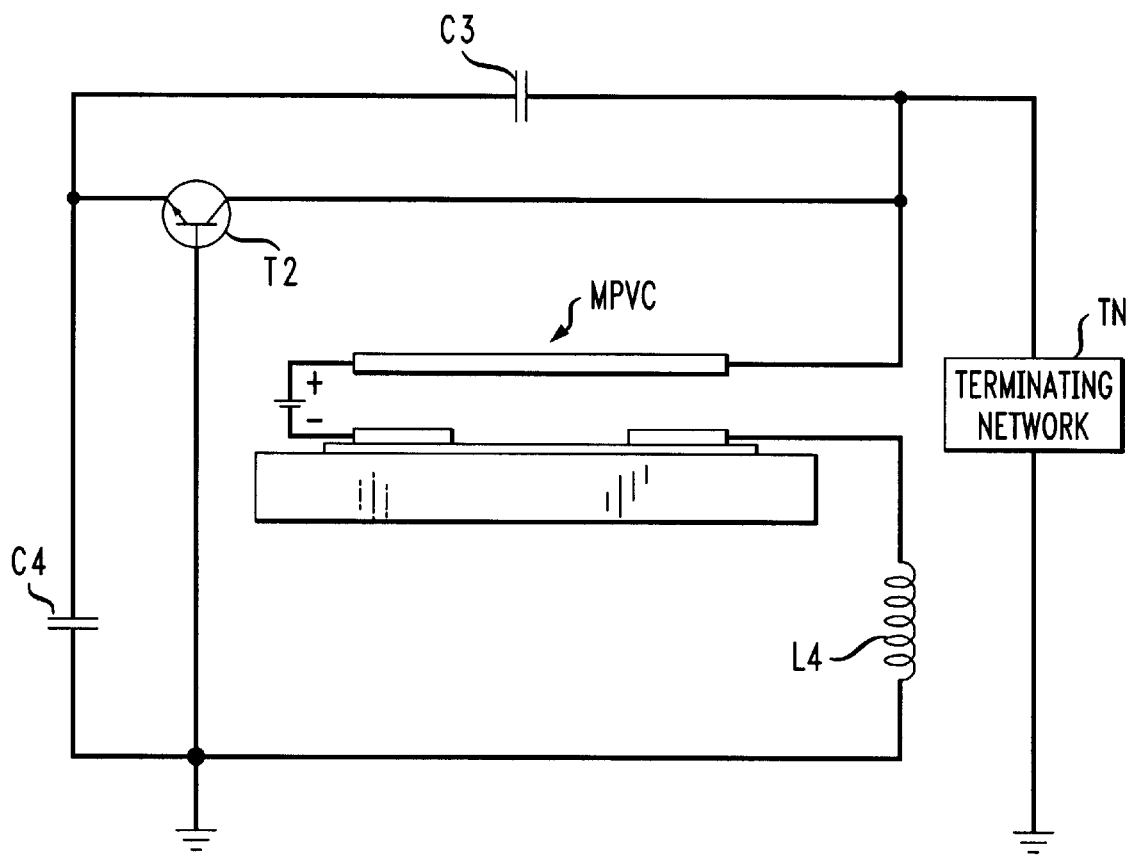
FIG. 20 depicts a variable frequency oscillator in accordance with the present teachings.

FIG. 20 depicts an illustrative embodiment of an improved Clapp oscillator wherein variable capacitor VC3 of FIG. 19 is replaced with multi-port variable capacitor MPVC in accordance with the present teachings. FIG. 20 also depicts terminating network TN since in most if not all applications, an oscillator is connected to some additional circuitry that make s use of the oscillating signal.

In some of the embodiments described above, it is advantageous or necessary to integrate methods for making the present multi-port variable capacitors, and methods for making MEMS-based inductors (if a MEMS-based inductor is used in preference to a standard CMOS-based inductor) with CMOS processing. Integrating methods are commercially available, and are generally readily adaptable to meet the needs of a particular MEMS application. One such process is the "BiMOSIIe®" process available from Analog Devices, Inc. of Norwood, Mass. The BiMOSIIe® process integrates a surface micromachining process suitable for forming MEMS structures with a CMOS process suitable for forming devices useful for analog applications. The BiMOSIIe® process nominally utilizes a single structural polysilicon layer and associated sacrificial layer for creating MEMS structures. Additional polysilicon layers can be used in this or other processes to provide more functionality as desired. Information concerning the BiMOSIIe® process is provided on Analog Devices/ MCNC server pages at http://imems.mcnc.org. See also, U.S. Pat. No. 5,326,726 to Tsang et al. entitled "Method for Fabricating Monolithic Chip Containing Integrated Circuitry and Suspended Microstructure;" and U.S. Pat. No. 5,620,931 to Tsang et al. entitled "Methods for Fabricating Monolithic Device Containing Circuitry and Suspended Microstructure," both of which are incorporated by reference herein.

Additionally, methods for monolithically integrating MEMS structure in a CMOS chip are offered by the University of California at Berkley, and Sandia National Labs of Albuquerque, N. Mex.

It is to be understood that the embodiments described herein are merely illustrative of the many possible specific arrangements that can be devised in application of the principles of the invention. Other arrangements can be devised in accordance with these principles by those of ordinary skill in the art without departing from the scope and spirit of the invention. It is therefore intended that such other arrangements be included within the scope of the following claims and their equivalents.

We claim:

1. An article comprising a multi-port variable capacitor, the multi-port variable capacitor comprising:

first and second co-planar electrically-isolated electrodes;

a plate spaced from said first and second electrodes and not co-planar therewith, said plate movable from a neutral position towards at least the first electrode when a bias voltage is applied across the first electrode and the plate, wherein, as the plate moves towards the first electrode, a first capacitance between said first electrode and the plate, and a second capacitance between said second electrode and the plate, changes; and further wherein said article is operable to sense the change in said second capacitance.

2. The article of claim 1, further comprising supports in mechanical contact with the plate for spacing the plate from said first and second electrodes.

3. The article of claim 2, wherein said supports are resilient for imparting a restoring force to the plate.

4. An article comprising a multi-port variable capacitor, the multi-port variable capacitor comprising:

first and second co-planar electrically-isolated electrodes;

a plate spaced from said first and second electrodes and not co-planar therewith, said plate movable from a neutral position towards at least the first electrode when a bias voltage is applied across the first electrode and the plate wherein, as the plate moves towards the first electrode, a first capacitance between said first electrode and the plate, and a second capacitance between said second electrode and the plate, changes; and supports in mechanical contact with said plate for spacing the plate from said first and second electrodes, wherein:
said supports are resilient for imparting a restoring force to said plate; and
the supports are conductive so that the voltage applied to the plate is delivered via the supports.

5. An article comprising a multi-port variable capacitor, the multi-port variable capacitor comprising:

first and second co-planar electrically-isolated electrodes;

a plate spaced from said first and second electrodes and not co-planar therewith, said plate movable from a neutral position towards at least the first electrode when a bias voltage is applied across the first electrode and the plate; and a connection for electrically connecting an AC signal line to the second electrode, wherein, as the plate moves towards the first electrode, a first capacitance between said first electrode and the plate, and a second capacitance between said second electrode and the plate, changes.

6. An article comprising a multi-port variable capacitor, the multi-port variable capacitor comprising:

first and second co-planar electrically-isolated electrodes;

a plate spaced from said first and second electrodes and not co-planar therewith, said plate movable from a neutral position towards at least said first electrode on application of a voltage across said first electrode and said plate; and a fulcrum disposed between the first and second electrodes and beneath and contacting said plate, the fulcrum functionally dividing the plate into first and second segments.

7. The article of claim 6, wherein the article is a logic device, and further comprising:

a third electrode disposed beneath said plate;

a first connection for electrically connecting the first electrode to a first AC signal; and a second connection for electrically connecting the second electrode to a second AC signal; wherein, a third signal readable at the third electrode is dependent upon a first value of the first AC signal and a second value of the second AC signal.

8. The article of claim 7, wherein the first and second values are representative of a voltage of each of the first and second AC signals.

9. The article of claim 7, and further comprising:

a third electrode disposed between the first and second electrodes underneath the first segment of the plate; and a fourth electrode disposed between the third and second electrodes underneath the second segment of the plate.

10. A LC circuit comprising:

a multi-port variable capacitor, said multi-port variable capacitor comprising:

first and second co-planar electrically-isolated electrodes; and a plate spaced from said first and second electrodes and not co-planar therewith, said plate movable from a neutral position towards at least said first electrode on application of a voltage across said first electrode and said plate;

an inductor electrically connected to the multiport variable capacitor; and a signal generator.

11. The article of claim 10, wherein the inductor and the multi-port variable capacitor are connected in series.

12. The article of claim 10, wherein the inductor and the multi-port variable capacitor are connected in parallel.

13. The article of claim 10, wherein the article is a variable-frequency oscillator, the article further comprising a negative resistance device electrically connected to the LC circuit.

14. The article of claim 13, wherein the negative resistance device is a transistor, the article further comprising a terminating network electrically connected to the transistor.

15. An article comprising a multi-port variable capacitor, the multi-port variable capacitor comprising:

a first and a second electrode, wherein said first and second electrodes are co-planar and electrically isolated from one another;

a plate disposed in superposed and spaced relation from said first and second electrodes;

supports for supporting the plate in said superposed and spaced relation, wherein said supports are resilient and conductive;

a fulcrum disposed between the first and second electrodes and beneath and contacting said plate, the fulcrum functionally dividing the plate into first and second segments;

a first connection by which a first electrical signal is connected across the plate and the first electrode; and a second connection by which a second electrical signal is connected across the plate and the second electrode.

16. A variable-frequency oscillator, the variable-frequency oscillator having:

a load incorporating an LC circuit;

a transistor electrically connected to the load; and a terminating network electrically connected to the transistor, wherein, said LC circuit comprises a multi-port variable capacitor the multi-port variable capacitor comprising:

a first and a second electrode, wherein said first and second electrodes are co-planar and electrically isolated from one another;

a plate disposed in superposed and spaced relation from said first and second electrodes;

supports for supporting the plate in said superposed and spaced relation, wherein said supports are resilient and conductive;

a first connection by which a first electrical signal is connected across the plate and the first electrode; and a second connection by which a second electrical signal is connected across the plate and the second electrode.

17. A method for performing logic using a plate disposed on a fulcrum and spaced from three electrodes, comprising the steps of:

applying a first signal across the first electrode and the plate;

applying a second signal across the second electrode and the plate; and reading a third signal from the third electrode, wherein the third signal is determined as a function of the first and second signals.

18. The method of claim 17, wherein the third signal is determined from a truth table providing the logic state of the third signal as a function of the logic states of the first and second signals.

* * * * *